United States Patent [19]

Woo et al.

[11] Patent Number: 4,997,790

[45] Date of Patent: Mar. 5, 1991

[54] PROCESS FOR FORMING A SELF-ALIGNED CONTACT STRUCTURE

[75] Inventors: Michael P. Woo; Thomas C. Mele; Wayne J. Ray; Wayne M. Paulson, all of Austin, Tex.

[73] Assignee: Motorola, Inc., Schaumburg, Ill.

[21] Appl. No.: 566,185

[22] Filed: Aug. 13, 1990

[51] Int. Cl.$^5$ .............................................. H01L 21/44
[52] U.S. Cl. .................................... 437/195; 437/228; 437/978; 148/DIG. 105; 148/DIG. 161
[58] Field of Search .............. 437/195, 978, 982, 228; 148/DIG. 133, DIG. 161, DIG. 105

[56] References Cited

U.S. PATENT DOCUMENTS

| | | | |
|---|---|---|---|
| 4,707,457 | 11/1987 | Erb | 437/195 |
| 4,839,311 | 6/1989 | Riley et al. | 437/228 |
| 4,868,138 | 9/1989 | Chen et al. | 437/195 |
| 4,883,767 | 11/1989 | Gray et al. | 437/228 |
| 4,892,845 | 1/1990 | Bridges | 148/DIG. 133 |

FOREIGN PATENT DOCUMENTS 59-117134 7/1984 Japan ................................. 437/982

*Primary Examiner*—Brian E. Hearn
*Assistant Examiner*—Laura M. Holteman
*Attorney, Agent, or Firm*—Robert L. King

[57] ABSTRACT

A self-aligned contact is formed in a multi-layer semiconductor device. In one form, conductive members are formed overlying a substrate material and a first insulating layer is deposited overlying the substrate material and the conductive members. A film of material is deposited on the first insulating layer and the film of material is patterned to form a sacrificial plug in an area where a contact is to be made. A second insulating layer is deposited on the device, and the device is made substantially planar. The second insulating layer is etched back to expose the sacrificial plug. The sacrificial plug is removed by selectively etching the device such that the first and second insulating layers are left substantially unaltered. An anisotropic etch of the device is performed to expose an area of the substrate material on which a contact is to be made, and to simultaneously form sidewall spacers along edges of the conductive members. A conductive layer is deposited onto the device and patterned, thereby forming a self-aligned contact.

17 Claims, 5 Drawing Sheets

PROCESS FOR FORMING A SELF-ALIGNED CONTACT STRUCTURE

CROSS REFERENCE TO RELATED APPLICATION

This application is related to the commonly assigned co-pending patent application entitled "Method for Forming a Multi-Layer Semiconductor Device Using Selective Planarization," by Mele, et al., Ser. No. 07/546,801, filed July 2, 1990.

TECHNICAL FIELD OF THE INVENTION

This invention relates to semiconductor fabrication processes in general, and more specifically to a process for forming contacts in multi-layer semiconductor devices.

BACKGROUND OF THE INVENTION

Semiconductor product manufacturers must continually improve the power and performance of semiconductor devices while keeping the device size to a minimum. A common way to achieve a smaller device is to simply shrink the dimensions. Another widely practiced method of keeping the semiconductor device size to a minimum is achieved by designing and fabricating devices having multiple conductive layers. This is apparent in double-level and triple-level polysilicon and metallization processes.

Manufacturing difficulties have arisen with these complex processes. For example, with smaller and smaller geometries, alignment tolerances in photolithography operations have been significantly reduced. Another difficulty with fabricating multi-layer devices is that of planarizing the various layers. Several known planarization techniques and disadvantages with the techniques are described in the background of the above cited co-pending patent application, Ser. No. 07/546,801. The co-pending application teaches how to selectively planarize a semiconductor device, in other words, how to planarize only areas of the device in which contacts are not to be formed. With the selective planarization process disclosed in the co-pending application, a self-aligned contact is formed and the device is planarized without having to etch overly thick insulating layers.

Another common semiconductor device fabrication problem is the guaranteeing of electrical isolation of a self-aligned contact from underlying conductive members. While etching an insulating layer of the device, sidewall spacers are often formed along conductive members to provide electrical isolation. However, in order to completely etch the insulating material from an area in which a contact is to be formed, the integrity of the sidewall spacers is typically difficult to maintain during the etch process. Sidewall spacers are also attacked during subsequent cleaning steps. Without adequate isolation, the conductive members may be electrically shorted to other conductive members, for instance a contact, possibly causing the device to fail.

BRIEF SUMMARY OF THE INVENTION

The previously discussed problems are overcome with the present invention, which is a process for fabricating a self-aligned contact in a multi-layer semiconductor device using selective planarization and a sacrificial plug. In one form of the invention, a first insulating layer is provided, overlying a substrate material. A film of material is deposited overlying the first insulating layer, the film of material having the ability to be etched selectively to the first insulating layer. The film of material is selectively etched to expose areas of the first insulating layer, and a second insulating layer is deposited overlying the exposed areas of the first insulating layer and the film of material. The second insulating layer is etched to expose the film of material. The film of material is selectively etched to expose areas of the first insulating layer, while keeping the first and second insulating layers substantially unaltered. Selected areas of the substrate material are exposed by anisotropically etching the exposed areas of the first insulating layer. A conductive layer is deposited and patterned, thereby forming a contact to the exposed areas of the substrate material.

DETAILED DESCRIPTION OF THE INVENTION

Figure 1A:
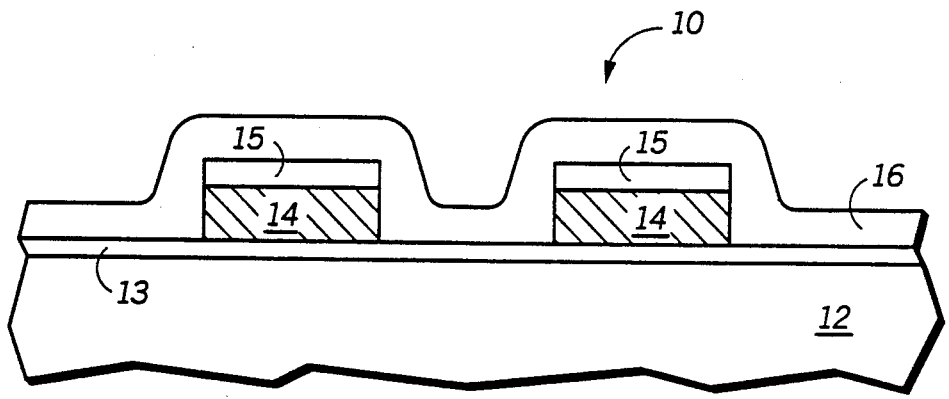
FIGS. 1A–1G are cross-sectional views of a semiconductor device fabrication process in which a self-aligned contact structure is formed in accordance with the present invention.

Known problems associated with both forming contacts in sub-micron regions while guaranteeing electrical isolation of underlying conductive members, and of planarizing intermediate layers of a multi-layer semiconductor device are concurrently resolved with the present invention. The series of illustrations in FIGS. 1A–1G represent one form of the invention in which the problems noted above are resolved. In FIG. 1A, a semiconductor device 10 includes spaced apart conductive members 14 overlying a substrate material 12. An oxide layer 13, often referred to as gate oxide, separates and provides electrical isolation between conductive members 14 and substrate material 12. Conductive members 14 are typically of the same material, generally comprising one of polysilicon, aluminum, aluminum alloys, tungsten, or other conductive materials. The distance between conductive members 14 is assumed to be in the sub-micron to two microns range but may be extended outside this range. Substrate material 12 is typically made of silicon, but may be of another material, such as any of the III-V compounds used in the semiconductor industry. It should be noted that substrate material 12 may also be an intermediate layer of a semiconductor device such as a polysilicon or metal layer, rather than the bulk of a semiconductor device. A dielectric layer 15 is patterned on conductive members 14 for reasons to be discussed later. Dielectric layer 15 may be one of or a combination of $SiO_2$, $Si_3N_4$, or any other material which may be used as a dielectric. A first insulating layer 16 is deposited onto device 10 in FIG. 1A. Insulating materials such as $SiO_2$, PSG (phospho-silicate-glass), or BPSG (boron doped phospho-silicate-glass) are commonly used materials which are suitable for first insulating layer 16.

Figure 1B:
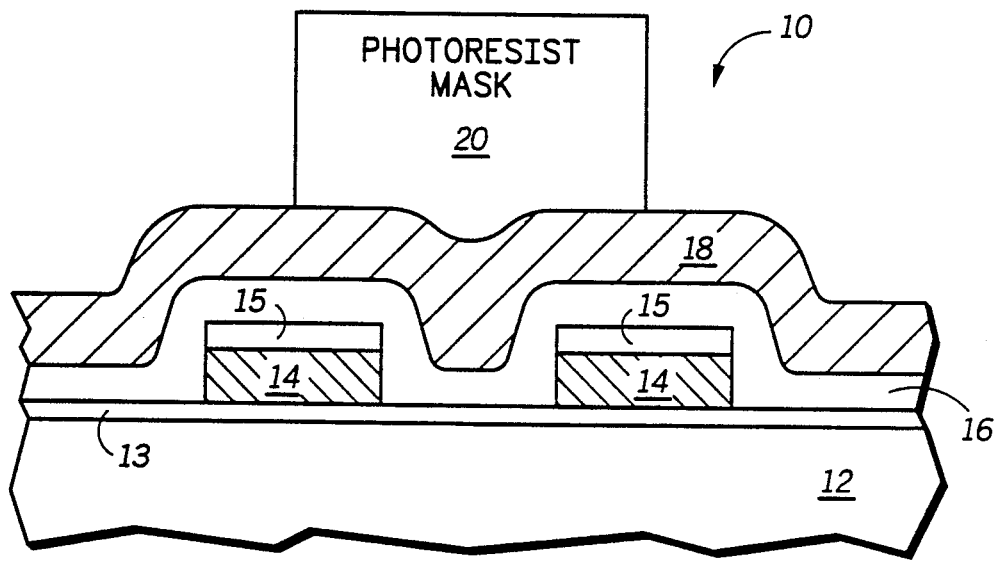

FIG. 1B illustrates the process by which a sacrificial plug is formed to define a contact opening. A film of material 18 is deposited onto device 10. The composition of film of material 18 is chosen such that the film of material 18 can be selectively etched with respect to insulating materials used in fabricating device 10. For example, polysilicon and Si₃N₄ are each suitable for film of material 18 since they can be etched selective to most insulating oxide layers. Tungsten or titanium nitride may also be used for film of material 18. The thickness of film of material 18 may depend on other requirements if film of material 18 is also incorporated into actual circuitry on other portions of semiconductor device 10. On the film of material 18, a photoresist layer is deposited and patterned to form a photoresist mask 20, using conventional photolithography techniques. The photoresist layer is patterned such that the area in which a contact is to be formed is defined as the area underlying photoresist mask 20.

Figure 1C:
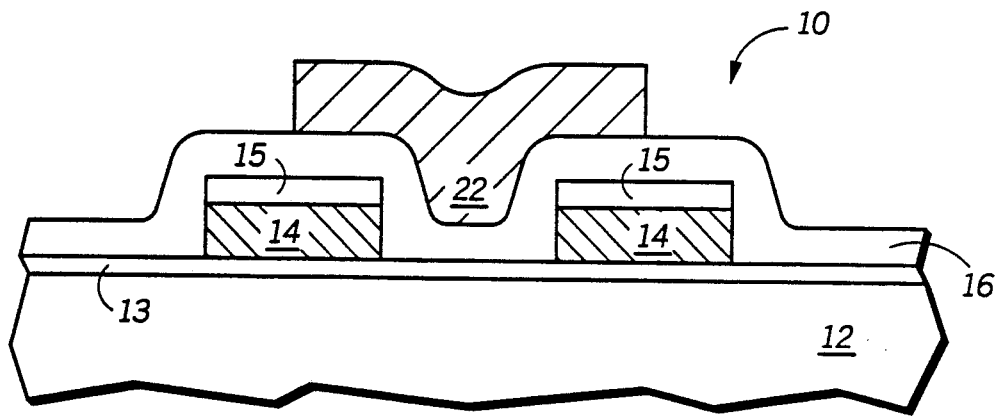

The unmasked portions of the film of material 18 are removed by exposing device 10 to an etch, thereby forming a sacrificial plug 22, as illustrated in FIG. 1C. The etching of film of material 18 to form sacrificial plug 22 may be accomplished by using either wet or dry etch chemistries, depending on the choice of material for film of material 18. For example, a wet etch chemistry of nitric and HF (hydrofluoric) acids will remove a polysilicon film without damaging an underlying oxide layer. Likewise, a heated phosphoric acid could be used to remove a Si₃N₄ film while maintaining the integrity of an underlying oxide layer. Dry etching using chlorine-based chemistries will also provide the same result of forming a sacrificial plug 22, while not substantially attacking the underlying first insulating layer 16.

Figure 1D:
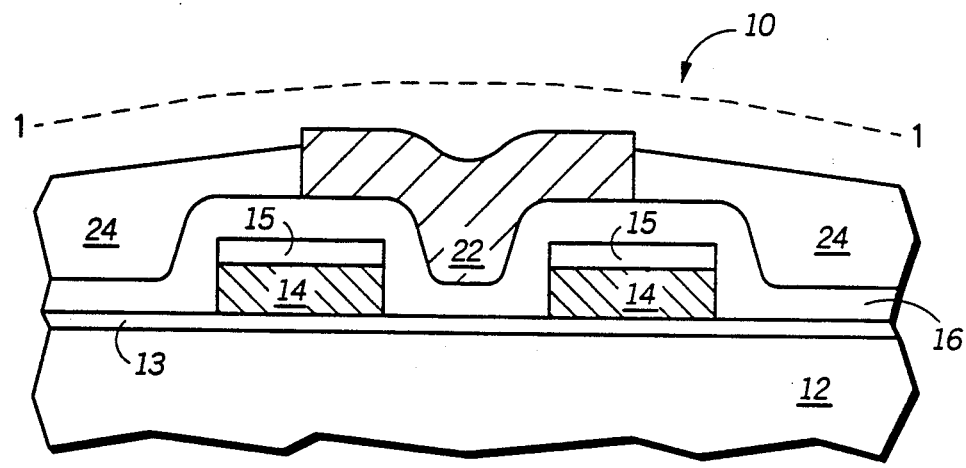

As illustrated in FIG. 1D, a second insulating layer 24 is deposited onto device 10. Second insulating layer 24 may be comprised of materials such as those suitable for first insulating layer 16, including, but not limited to SiO₂, PSG, or BPSG. Possible deposition techniques for these insulating materials are CVD (chemical vapor deposition) using SiH₄ or TEOS (tetra-ethyl-ortho-silicate) source gases or using a SOG (spin-on-glass). Upon deposition, second insulating layer 24 will initially overlie the entire device 10, as illustrated by curved line 1—1, and is used to planarize device 10. In some forms, the top surface of second insulating layer 24 may initially be planar. The planarization of the device may be achieved in a variety of ways. The second insulating layer 24 may be deposited thickly, on the order of 0.5–1.5 μm, and then etched back to provide a planarized layer. Another planarization technique is to deposit the second insulating layer 24 as illustrated by curved line 1—1 and heat the device 10, thereby flowing the second insulating layer. If using SOG as the second insulating layer 24, the device becomes planar upon deposition. Once the second insulating layer 24 is deposited and device 10 is planarized, the device is subjected to a blanket etch which uniformly etches a top portion of the second insulating layer 24 from device 10. The etch is stopped at the point in which the sacrificial plug 22 is exposed, as illustrated in FIG. 1D. The material of sacrificial plug 22 may be chosen so that the material provides for a good etch-stop as well. For instance, a polysilicon sacrificial plug will provide a good etch-stop for most insulating oxide layers since the selectivity of an oxide etch to polysilicon is quite high. Either a timed etch or an etch having endpoint detection capability would be suitable for use in exposing sacrificial plug 22.

Figure 1E:
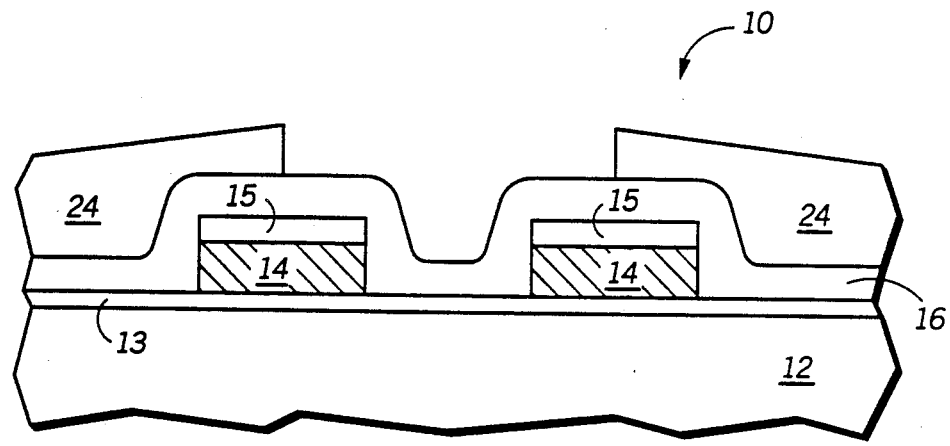

The exposed sacrificial plug 22 is removed, as in FIG. 1E, using an etch which is selective to the material chosen for the first and second insulating layers, 16 and 24 respectively. The desired result is to remove sacrificial plug 22 without substantially altering the first and second insulating layers, 16 and 24 respectively. Again, if the sacrificial plug is of polysilicon, a wet etch chemistry of nitric and HF (hydrofluoric) acids will remove the sacrificial plug without damaging any surrounding oxide regions. Likewise, a heated phosphoric acid could be used to remove a Si₃N₄ sacrificial plug while maintaining the integrity of oxide regions such as dielectric layer 15. Dry etching may also be used to remove sacrificial plug 22. From FIG. 1E it is evident that upon removing sacrificial plug 22, device 10 is no longer completely planar, rather only areas outside of a region vacated by sacrificial plug 22 in which a contact is to be formed are planarized. Thus, this planarization technique is referred to as "selective planarization". Selective planarization is an improvement over existing planarization techniques in that selective planarization reduces the need to etch through thick insulating layers to form vias or contact openings.

Figure 1F:
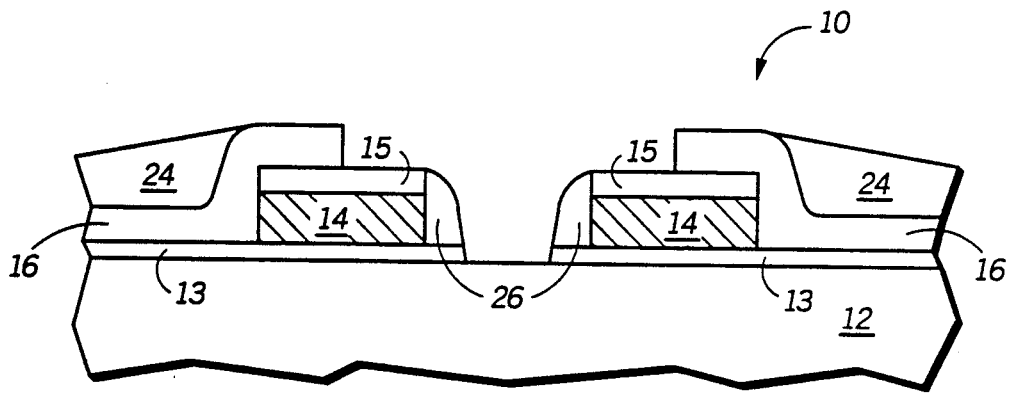

In order to make electrical contact to substrate material 12, portions of first insulating layer 16 and gate oxide layer 13 must be removed. As illustrated in FIG. 1F, device 10 is subjected to an anisotropic etch to expose a portion of the underlying substrate material 12 while keeping conductive members 14 isolated by maintaining an insulating material on all sides. An anisotropic etch of first insulating layer 16 forms sidewall spacers 26 from first insulating layer 16 along the interior sides of conductive members 14. Dielectric layer 15 provides isolation on the top surface of conductive members 14. In order to completely remove first insulating layer 16 from between conductive members 14, the etch also removes exposed portions of first insulating layer 16 which lie above conductive members 14. Normally, this would expose the conductive members 14, however by having dielectric layer 15 on top of conductive members 14, isolation is maintained after etching. Although the anisotropic etch also attacks second insulating layer 24, planarization of device 10 is still maintained.

Figure 1G:
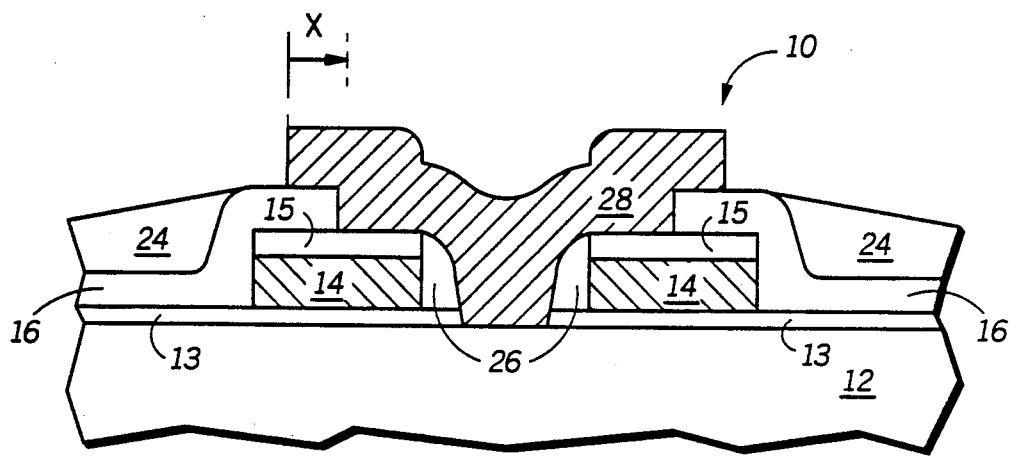

A self-aligned contact is formed by depositing and patterning a conductive layer. FIG. 1G illustrates a self-aligned contact 28 which makes electrical contact to substrate material 12. The conductive layer used to form contact 28 may be of polysilicon, aluminum, aluminum alloys, or any conductive material used in the fabrication of semiconductor devices to make electrical contact. Contact 28 is considered to be self-aligned because the underlying device structures (e.g. the sidewall spacers 26) define the area where contact is made to substrate material 12. An advantage of a self-aligned contact is that there is more room for alignment error than in forming traditional contact structures. For example, if the patterning of contact 28 is misaligned by a distance 'X' as illustrated in FIG. 1G, a reliable contact to substrate material 12 is still formed.

Figure 2A:
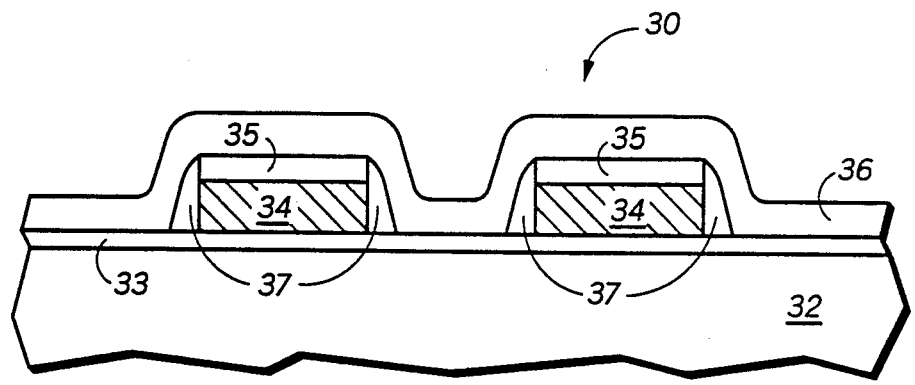
FIGS. 2A–2G are cross-sectional views illustrating another embodiment of the present invention.

In another form of the invention, sidewall spacers are formed prior to defining the contact opening with a sacrificial plug. Illustrated in FIG. 2A is a semiconductor device 30. As in the previous form, semiconductor device 30 has a substrate material 32 above which is formed conductive members 34. A gate oxide layer 33 separates conductive members 34 from substrate material 32. A dielectric layer 35 is formed on conductive members 34 in order to guarantee that conductive members 34 remain isolated throughout subsequent processing. A variety of materials may be chosen for each of substrate material 32, conductive members 34, gate oxide layer 33, and dielectric layer 35. For examples of suitable materials, refer to those described in the previous form of the invention.

As an additional guarantee that conductive members 34 remain isolated, sidewall spacers 37 are formed along the sides of conductive members 34. While it is not necessary that sidewall spacers 37 be included at this point in the process (an example being the previously discussed embodiment), one form of the invention including sidewall spacers 37 is described. Sidewall spacers 37 are typically formed by depositing an $Si_3N_4$ layer onto sgate oxide layer 33 and conductive members 34. An anisotropic etch is performed on the device, leaving sidewall spacers 37 along the sides of conductive members 34.

Following the formation of sidewall spacers 37, it may be necessary to deposit a first insulating layer 36 onto device 30, overlying substrate material 32, conductive members 34, dielectric layer 35, and sidewall spacers 37. Depositing the first insulating layer 36 is necessary only if the film of material used to form a sacrificial plug, at a later point, cannot be etched selectively to sidewall spacers 37. For instance, if the film of material used for a sacrificial plug is polysilicon, the film of material could not be etched selectively to $Si_3N_4$ sidewall spacers with certain etch chemistries, such as a nitrichydrofluoric acid solution. In this case it would be necessary to add first insulating layer 36, as illustrated in FIG. 2A, to act as an etch-stop. An oxide would be a suitable material for first insulating layer 36 since a polysilicon film of material can be selectively etched to oxide. A case in which including first insulating layer 36 is not necessary is one in which a polysilicon film of material is etched with a nitric/HF (e.g. 750:1) acid solution. Such a solution can be conventionally controlled such that $Si_3N_4$ sidewall spacers would not be attacked while etching a polysilicon film of material.

Since isolation of conductive members 34 is guaranteed by sidewall spacers 37, the first insulating layer 36 of FIG. 2A may be deposited thinner than in the previous embodiment. In the previous embodiment, the first insulating layer was later etched to form sidewall spacers, whereas in the form presently being described, sidewall spacers already exist. If a first insulating layer is incorporated into device 30, the thickness of the first insulating layer is not critical in this form of the invention.

Figure 2B:
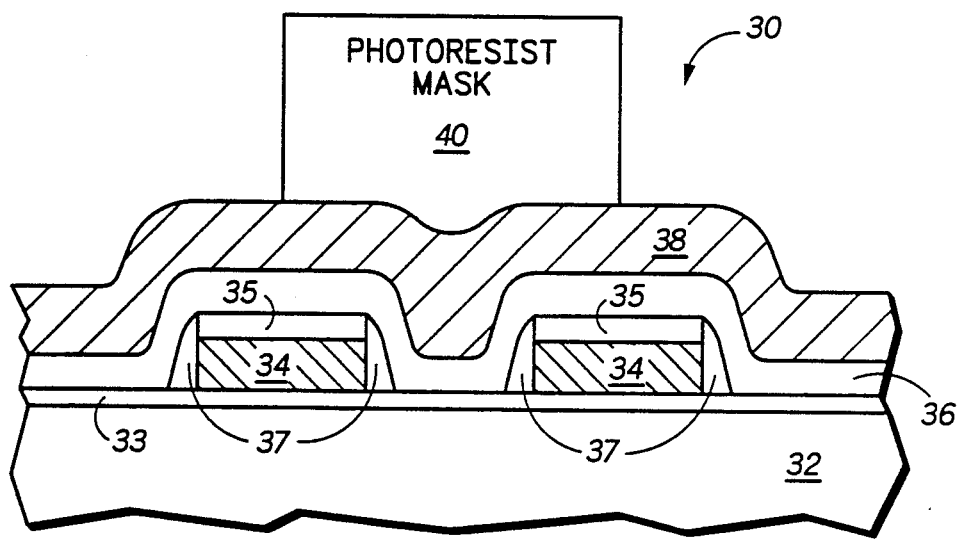
Figure 2C:
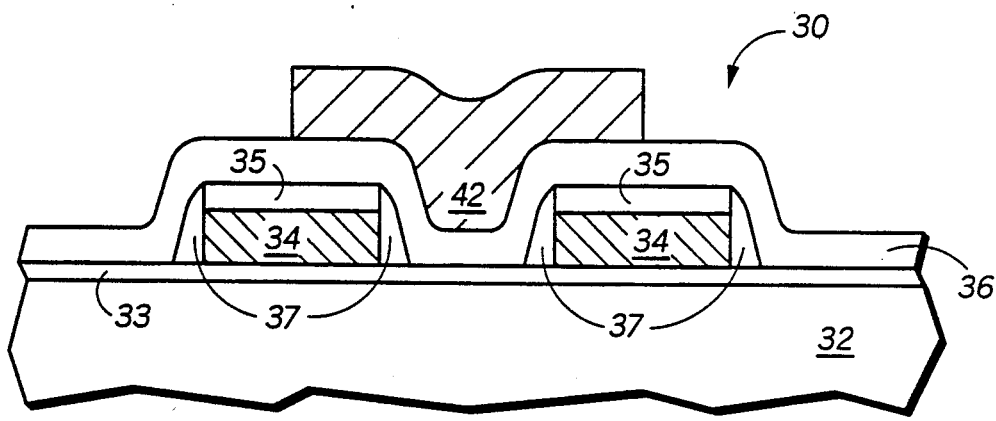

The remaining processing steps are similar to those previously described for the first embodiment of the invention. As illustrated in FIG. 2B, a film of material 38 is deposited onto device 30. Again, film of material 38 may comprise any one of a variety of materials such as polysilicon, $Si_3N_4$, or tungsten. However, film of material 38 must have the ability to be etched selectively to the underlying layers (for instance to the first insulating layer 36 or to sidewall spacers 37). A photoresist mask 40 is formed on device 30 to protect or mask the region of device 30 in which a contact opening is to be made. Illustrated in FIG. 2C, the film of material 38 is etched, leaving a sacrificial plug 42 of the same material as that of film of material 38. The position of sacrificial plug 42 is determined by the placement of photoresist mask 40 in FIG. 2B.

Figure 2D:
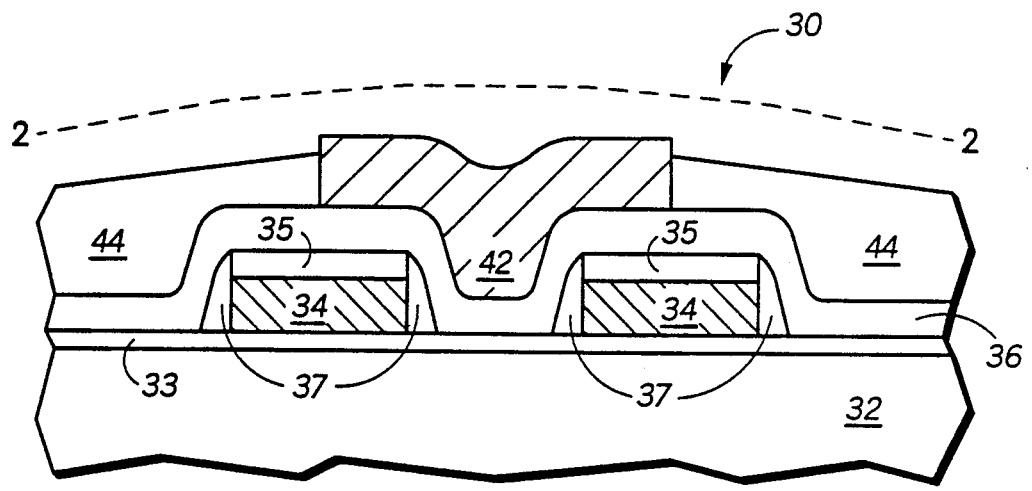
Figure 2E:
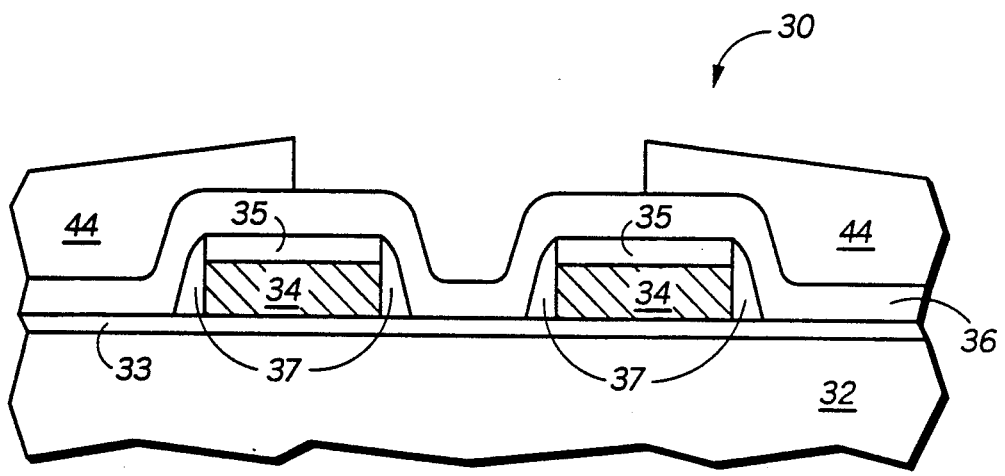

A second insulating layer 44 is deposited onto device 30, as illustrated in FIG. 2D. Upon deposition, second insulating layer 44 overlies the entire device 30, as illustrated by curved line 2—2, and is used to planarize device 30. Again, in some forms the top surface of second insulating layer 44 may initially be planar. The planarization of the device may be achieved in a variety of ways, including those mentioned previously. Once the second insulating layer 44 is deposited and device 30 is planarized, the device 30 is subjected to a blanket etch which uniformly etches a top portion of the second insulating layer 44. The etch is stopped at the point in which the sacrificial plug 42 is exposed, as illustrated in FIG. 2D. Exposed sacrificial plug 42 is then removed from device 30, as FIG. 2E illustrates, by subjecting device 30 to an etch. In removing sacrificial plug 42 it is important that the etch is selective to the material of sacrificial plug 42 and that the etch does not substantially attack exposed areas of either the first or second insulating layers, 36 and 44 respectively. FIG. 2E also illustrates the manner in which device 30 is selectively planarized.

Figure 2F:
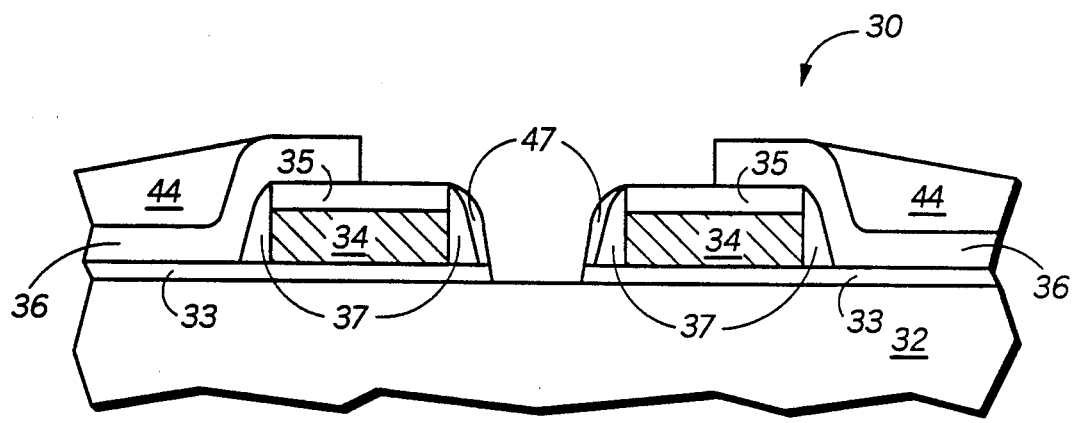

To completely form a contact opening, portions of first insulating layer 36 (if present) and gate oxide layer 33 must be also be removed. As illustrated in FIG. 2F, device 30 is anisotropically etched to remove portions of first insulating layer 36 and gate oxide layer 33 from between conductive members 34, thereby exposing a portion of substrate material 32. In the process of anisotropically etching device 30, second insulating layer 44 is also attacked by the etch, however planarization of device 30 is maintained. Also, additional sidewall spacers 47 are formed, interior to conductive members 34, over sidewall spacers 37. Additional sidewall spacers 47 are of the same material as first insulating material 36 and will only be formed if a first insulating layer is included in the fabrication of device 30.

Figure 2G:
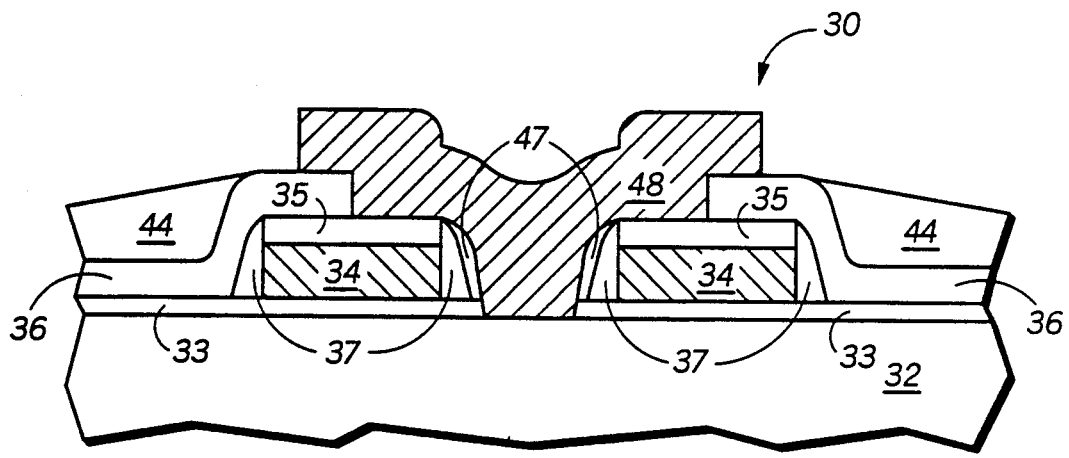

Contact is made to the exposed substrate material by subsequently depositing a conductive layer and patterning the conductive layer to form a contact 48, as illustrated in FIG. 2G. The conductive layer used to from contact 48 may be of polysilicon, aluminum, aluminum alloys, or other conductive material. As in other forms of the invention, contact 48 is self-aligned and not subject to alignment error.

The current problems of forming contacts in submicron regions while guaranteeing isolation of underlying conductive members may be overcome with the use of the present invention. The invention enables the formation of contacts in spaces on the order of 0.35 μm and less provided tha reliable sidewall spacers can be formed and maintained at this technology level with a satisfactory amount of process control. In addition to forming sub-micron self-aligned contacts, the invention also has the benefit of concurrently planarizing intermediate layers of a multi-layer semiconductor device. Another advantage of this invention is that the process is adaptable to the use of a wide variety of materials. For example, suitable insulating materials include $SiO_2$, PSG, BPSG, or SOG. Conductive materials may be polysilicon, aluminum alloys, or tungsten. The film of material which forms the sacrificial plug may include either $Si_3N_4$ or polysilicon. Therefore, the present invention may be incorporated into a number of existing processes.

Thus it is apparent that there has been provided, in accordance with the invention, a process for forming a self-aligned contact structure that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, use of the invention is not limited to use in semiconductor devices with features smaller than 1 μm, but may be used in semiconductor devices having features of any size. The invention is not limited to using the materials mentioned for the various elements of the invention, but may include use of any material which meets the needs of that particular element. Nor is the invention limited to the deposition, etch, and planarization techniques described or illustrated. In addition, it is not required the contact structure be fabricated on a substrate material which is a semiconductor material. The present invention may be implemented at other levels of a semiconductor device, such as metal interconnect layers. Therefore, it is intended that this invention encompass all such variations and modifications as fall within the scope of the appended claims.

We claim:

1. A process for fabricating a self-aligned contact in a multi-layer semiconductor device, comprising the steps of:
   providing a first insulating layer overlying a substrate material;
   depositing a film of material overlying the first insulating layer and having the ability to be selectively etched to the first insulating layer;
   selectively etching the film of material to expose selected areas of the first insulating layer;
   depositing a second insulating layer overlying exposed surfaces of the first insulating layer and the film of material;
   etching the second insulating layer to expose the film of material;
   selectively etching the film of material to expose selected areas of the first insulating layer while keeping the first and second insulating layers substantially unaltered;
   anisotropically etching the exposed selected areas of the first insulating layer to expose selected areas of the substrate material;
   depositing a conductive layer on the device; and
   patterning the conductive layer to form a contact to the exposed selected areas of the substrate material.

2. The process of claim 1 wherein the steps of depositing the first and second insulating layers comprise selecting the first insulating layer from a group comprising $SiO_2$ and $Si_3N_4$, and selecting the second insulating layer from a group comprising SOG, PSG, BPSG, $SiO_2$, and doped $SiO_2$.

3. The process of claim 1 wherein the step of depositing a film of material comprises depositing polysilicon.

4. The process of claim 1 wherein the step of depositing a film of material comprises depositing $Si_3N_4$.

5. The process of claim 1 further comprising the step of:
   following the step of depositing a second insulating layer, heating the second insulating layer in order to flow the second insulating layer.

6. A process for fabricating a self-aligned contact in a multi-layer semiconductor device, comprising the steps of:
   providing a substrate material;
   forming two separated conductive members overlying the substrate material, each of the conductive members having an overlying dielectric layer;
   depositing a first insulating layer on the device;
   depositing a film of material overlying the first insulating layer, the film of material having the ability to be etched selectively to the first insulating layer;
   selectively etching the film of material to expose selected areas of the first insulating layer;
   depositing a second insulating layer on the device;
   etching the second insulating layer to expose the film of material;
   selectively etching the film of material to expose selected areas of the first insulating layer while keeping the first and second insulating layers substantially unaltered;
   anisotropically etching the exposed selected areas of the first insulating layer to expose a portion of the substrate material;
   depositing a conductive layer on the device; and
   patterning the conductive layer to form a contact to the exposed portion of the substrate material.

7. The process of claim 6 further comprising the step of forming sidewall spacers on predetermined sides of the conductive members, prior to depositing the first insulating layer.

8. The process of claim 7 wherein the step of selectively etching the film of material comprises etching the film of material to expose selected areas of the first insulating layer which lie between the two separated conductive members.

9. The process of claim 8 wherein the step of anisotropically etching the exposed selected areas of the first insulating layer to expose a portion of the substrate material comprises etching the exposed selected areas of the first insulating layer to expose a portion of the substrate material which lies between the two separated conductive members.

10. The process of claim 7 wherein the steps of forming the conductive members, depositing a film of material, and depositing a conductive layer further comprise selecting materials for use in each of the steps from a group of materials comprising polysilicon, metals, refractory metals, refractory metal silicides, and selective epitaxial films.

11. The process of claim 7 wherein the step of forming two separated conductive members comprises spacing the conductive members an amount substantially in the submicron to two microns range.

12. The process of claim 7 wherein the step of forming sidewall spacers comprises selecting sidewall spacer material from the group consisting of $SiO_2$ and $Si_3N_4$.

13. The process of claim 7 wherein the step of depositing a second insulating layer comprises depositing a second insulating layer having a thickness which substantially planarizes a top surface of the device.

14. The process of claim 7 wherein the step of etching the second insulating layer comprises etching the second insulating layer to expose the film of material while substantially planarizing all other exposed portions of the device.

15. A process for fabricating a self-aligned contact in a multi-layer semiconductor device comprising the steps of:
   providing a substrate material;
   forming two separated conductive members overlying the substrate material, each of the conductive members having an overlying dielectric layer;
   forming sidewall spacers on predetermined sides of the conductive members;
   depositing a film of material overlying the conductive members, sidewall spacers, and substrate material, the film of material having the ability to be etched selectively to the sidewall spacers;
selectively etching the film of material to form a sacrificial plug;
depositing an insulating layer on the device;
etching the insulating layer to expose the sacrificial plug;
selectively etching the device to remove the sacrificial plug while keeping the insulating layer and sidewall spacers substantially unaltered, and exposing a portion of the substrate material;
depositing a conductive layer on the device; and
patterning the conductive layer to form a contact to the exposed portion of the substrate material.

16. The process of claim 15 wherein the steps of forming the separated conductive members, depositing a film of material, and depositing a conductive layer comprise selecting materials for use in each of the steps from the group consisting polysilicon, metals, refractory metals, refractory metal silicides, and selective epitaxial films.

17. The process of claim 15 wherein the step of forming sidewall spacers comprises selecting sidewall spacer material from the group consisting $SiO_2$ and $Si_3N_4$.

* * * * *